(12) United States Patent
Malik et al.

(10) Patent No.: US 8,345,998 B2
(45) Date of Patent: Jan. 1, 2013

(54) COMPRESSION SCHEME SELECTION BASED ON IMAGE DATA TYPE AND USER SELECTIONS

(75) Inventors: Amal Z. Malik, Pittsford, NY (US); Clara Cuciurean-Zapan, Fairport, NY (US); Xing Li, Webster, NY (US)

(73) Assignee: Xerox Corporation, Norwalk, CT (US)

(*) Notice: Subject to any disclaimer, the term of this patent is extended or adjusted under 35 U.S.C. 154(b) by 331 days.

(21) Appl. No.: 12/853,831

(22) Filed: Aug. 10, 2010

(65) Prior Publication Data
US 2012/0039534 A1 Feb. 16, 2012

(51) Int. Cl.
*G06K 9/36* (2006.01)
*G06K 9/34* (2006.01)
(52) U.S. Cl. ........................ 382/239; 382/173
(58) Field of Classification Search .......... 382/232–253, 382/162, 164, 173, 176; 358/1.15, 1.2, 1.9, 358/426.02; 375/240.01–240.29
See application file for complete search history.

(56) References Cited

U.S. PATENT DOCUMENTS

| | | | |
|---|---|---|---|
| 5,745,596 A | 4/1998 | Jefferson | |
| 5,778,156 A | 7/1998 | Schweid et al. | |
| 6,178,260 B1 | 1/2001 | Li et al. | |
| 6,198,850 B1 * | 3/2001 | Banton | 382/239 |
| 7,139,433 B2 * | 11/2006 | Li | 382/232 |
| 7,236,641 B2 | 6/2007 | Curry et al. | |
| 7,242,802 B2 | 7/2007 | Curry et al. | |
| 7,343,046 B2 | 3/2008 | Curry et al. | |
| 7,376,272 B2 | 5/2008 | Fan et al. | |
| 7,403,661 B2 | 7/2008 | Curry et al. | |
| 7,565,015 B2 | 7/2009 | Loce et al. | |
| 7,609,402 B2 * | 10/2009 | Chang et al. | 358/1.15 |
| 7,783,117 B2 * | 8/2010 | Liu et al. | 382/232 |
| 7,936,923 B2 * | 5/2011 | Liu et al. | 382/173 |
| 8,169,649 B2 * | 5/2012 | Chang et al. | 358/1.15 |
| 8,224,073 B2 * | 7/2012 | Nuuja et al. | 382/164 |
| 2007/0253620 A1 | 11/2007 | Nagarajan et al. | |
| 2010/0142820 A1 | 6/2010 | Malik et al. | |

OTHER PUBLICATIONS

U.S. Appl. No. 12/564,520, filed Sep. 22, 2009, Amal Malik.

* cited by examiner

*Primary Examiner* — Ishrat I Sherali
(74) *Attorney, Agent, or Firm* — Pillsbury Winthrop Shaw Pittman, LLP

(57) ABSTRACT

Disclosed is a processor-implemented method for processing image data comprising a plurality of pixels and system for performing the method. The method includes the following acts: determining at least one type of data represented by the plurality of pixels, determining, for each type of data, a number of pixels from the image data representing that type of data in the image data, and determining a compression scheme for compressing the image data based on a relative or absolute amount of each type of data in accordance with a predetermined scheme. The type of data may be determined by received input (e.g., user selected type and compression quality) or by analyzing its pixels and comparing it to thresholds. Basing the compression technique on the data type allows for better selection of a compression technique (e.g., MRC or JPEG), and thus greater image quality, compression ratios, and file size.

20 Claims, 7 Drawing Sheets

COMPRESSION SCHEME SELECTION BASED ON IMAGE DATA TYPE AND USER SELECTIONS

BACKGROUND

1. Field of Invention

The present invention is generally related to a method of and system for improving quality and size of image data. More specifically, the present disclosure relates to a method of and a system for selecting a compression scheme based on the type of image data being processed, and may include user selections such as original type of data, file size, image quality, etc.

2. Description of Related Art

Before image data is stored (and later output) to a digital output device, the image data is preferably compressed, i.e., coded to minimize the space needed to store and output the image data. In particular, due to its large size, digital image data for export or that is output to a device such as a multi-function printer (e.g., for copying and/or printing) typically requires compression.

One technique for manipulating digital image data includes segmentation (or auto-segmentation). Segmenting image data into two or more planes tends to improve compression of the image, and also allows different compression methods to be applied to the different planes. For example, it is generally known in the art that a compression scheme such as mixed raster content (MRC) (also referred to as multiple raster content) may be used by digital multifunction devices (MFDs) or printers to manipulate and compress image data (such as image data comprising mixed content such as text and pictorial data). Examples of common MRC schemes include 3-layer MRC and N-layer MRC models. Such MRC compression models are becoming increasingly popular for image storage or archiving, especially for text and mixed content documents and forms because of their increased compressibility. Alternatively, other compression methods, such as JPEG compression, may be used to compress image data.

Current devices typically apply one of the above noted compression schemes to process image data, regardless of the image data type and/or user selection of job parameters. This results poor image quality in some images, sometimes along with a poor compression ratio.

As such, a method of and a system for selecting a compression scheme based on the type of image data being processed is desirable in order to at least improve output image quality as well as file size.

SUMMARY

One aspect of the disclosure provides a processor-implemented method for processing image data comprising a plurality of pixels. The method includes the following acts implemented by a processor:

determining at least one type of data represented by the plurality of pixels;
  determining, for each type of data, a number of pixels from the image data representing that type of data in the image data, and
  determining a compression scheme for compressing the image data based on a relative or absolute amount of each type of data in accordance with a predetermined scheme.

Another aspect of the disclosure provides a system for processing image data comprising a plurality of pixels. The system has: an input device for receiving the image data and a processor configured to process the image data. The processor includes code executable by the processor for performing a method including:

determining at least one type of data represented by the plurality of pixels;
  determining, for each type of data, a number of pixels from the image data representing that type of data in the image data, and
  determining a compression scheme for compressing the image data based on a relative or absolute amount of each type of data in accordance with a predetermined scheme.

Other objects, features, and advantages of the present invention will become apparent from the following detailed description, the accompanying drawings, and the appended claims.

DETAILED DESCRIPTION OF THE PREFERRED EMBODIMENT(S)

Various exemplary embodiments of a system and methods according to this disclosure process image data of documents to produce highly-compressed image data files that accurately capture the original document content and provide optimal file size and image quality balance for processing and output. File size and quality are some factors that customers face when compressing and exporting color images using digital multifunction devices and printers. Apart from offering different resolutions, different compression schemes are being offered in these devices as well.

Depending on the type of data received, and/or a desired output of the image data, a user-selected, pre-selected, pre-set, or default compression technique for compressing and/or processing image data may not provide a desirable image file size or image quality for output. The disclosed system and methods produce better image quality as well as give more optimal compression ratios for image data by considering the image data type(s) and/or user selection of job parameters (e.g., for a specific device or machine). Additional features and advantages of the method and system will become evident throughout the description below.

Figure 1:
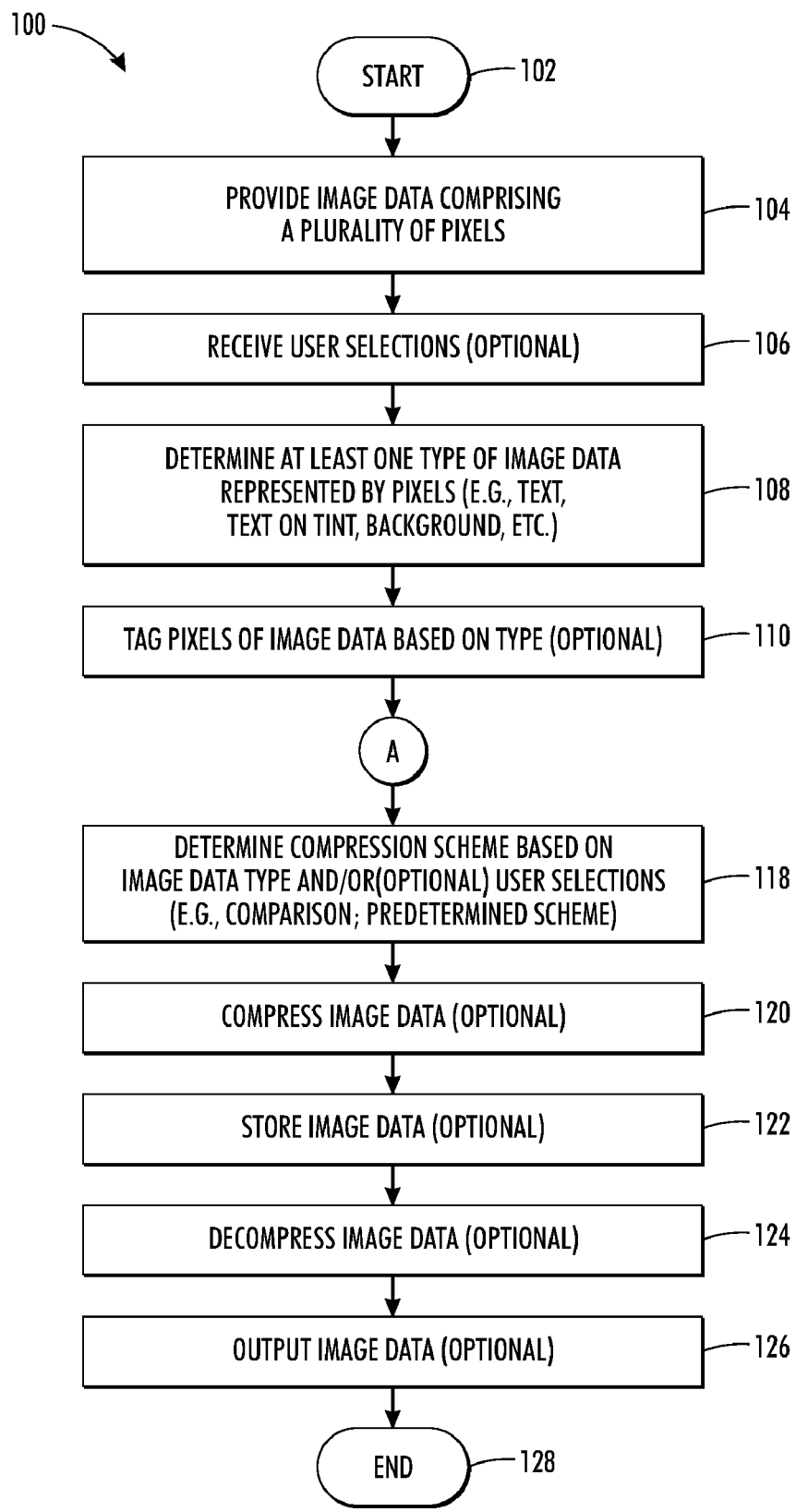
FIG. 1 illustrates a flow diagram of a method for processing image data in accordance with an embodiment of the present disclosure.

FIG. 1 illustrates a flow chart diagram illustrating a method 100 of processing image data in accordance with an embodiment. As the method 100 is started at 102, image data comprising a plurality of pixels is provided at 104. The image data may be provided or received as input, for example, by an image capture device, or retrieved via storage or memory. In embodiments, the image capture device may be an input device. As described below with respect to FIG. 4, an image capture device may be any type of device for providing input image data, such as a scanning device, facsimile device, computing device, storage device, etc. The image data is then processed to determine a compression scheme for compressing the image data.

After providing image data at 104, method 100 determines at least one type of data represented by the plurality of pixels of image data, as shown at 108, using some existing segmentation techniques. For example, the image data may comprise pixels representing—but not limited to—text, text on tint, edge, highlight, background, neutral text, and/or pictorial (non-text area) information. As will be further explained, any number of segmentation methods or techniques may be used for the determination of the type of data represented by the pixels of image data. Then, based on at least the determined type(s) of data represented by the plurality of pixels, a compression scheme is determined for compressing the image data, as shown at 118.

The method 100 may optionally include additional steps, which are not meant to be limiting. For example, after the compression scheme is determined at 118, the image data may optionally be compressed at 120 and stored 122, as shown in FIG. 1. Also, the image data may be optionally decompressed at 124 and output by an output device at 126, before the method 100 ends at 128. An output device may be any type of device that is designed to output the image data, such as output device 166 of FIG. 4. For example, the output device may display, copy, print, or send the image data. Such an output device may be an MFD or printer, for example. Further description with regard to output device is further provided below with respect to FIG. 4.

To determine the type(s) of data represented by the pixels, one or more methods may be used. In an embodiment, the determination of the at least one type of data comprises processing each pixel to identify a type of data represented by the pixel. For example, each pixel may be analyzed using neighboring pixels and/or window techniques (including morphological operations) to determine the data represented by the pixel of interest (e.g., edge data, background data, etc.). Such methods are generally known in the art and therefore are not explained in detail herein. In embodiments, the image data may be segmented to determine the type of data represented by the pixels using segmentation methods. For example, segmentation techniques may be used to identify pixels of an image, on a per pixel basis, into one of several possible classifications. Pixels may be classified (or segmented) on a pixel-by-pixel basis, into one of 32 different image types, for example. A processor may itself perform such segmentation, or have a designated module for analyzing the image data (e.g., performing such segmentation at the front end of the image path during processing of the image data). Such methods may be known in the art. The methods disclosed in U.S. Pat. Nos. 5,745,596, 5,778,156, 6,178,260, and 7,565,015, all assigned to Xerox Corporation and all of which are hereby incorporated by reference in their entirety, provide examples of segmentation methods that may be used to segment the image data.

In an embodiment, classification of pixels may be performed by assigning tags or pointers. For example, tags may be used to tag the pixels of image data to thereby identify the type of data represented by that pixel. The different tags assigned to the pixels of image data could include, but are not limited to, one or more of types of data to be identified such as: text on tint, edges, text, highlights, background, neutral text, and pictorial (non text areas). The tags can be any number of bits per pixel and may represent various types of data. Such tagging could be performed either using a segmentation module (e.g., such as module 158 in FIG. 4) or a compression selection module (e.g., such as module 176 or module 180 in FIG. 4). For example, if segmentation of the image data is performed in a front end image path of a system, the method 100 may optionally include tagging pixels of image data based on type determined at a result of the segmentation (e.g., by segmentation module 158), as shown at 110. Tags may also be applied after processing each pixel. Then, in such an embodiment, the tags are used to assist in determining and/or determine the compression scheme to be selected by the compression module (e.g., compression selection module 176 or compression module 180) at 118. The tags may be used in directly determining the compression scheme for optional file size/image quality balance, or indirectly for the determination (e.g., in further calculations, algorithms, etc.)

In one embodiment, the segmentation methods used in existing MRC compression schemes may be used to tag the image data/pixels. This would be beneficial, for example, in cases when one of many MRC compression schemes are to be applied to the image data.

In another embodiment, the determination comprises receiving a user's selection of the type of data provided by the image data. For example, as shown at 106, in an embodiment, user selections may be optionally received. Alternatively, such selections may be received before providing image data at 104. User selections may be made at a user interface that is associated with the system, a processor, or a printing device. The interface may be provided locally or remotely. The user selections that may be selected may include, for example, original type (or types) of data that is provided and/or a compression type or compression quality for compressing the image data. Either, both, or alternate user selections may be used to determine the compression scheme. Although the block 106 in FIG. 1 illustrates the user selections being optionally received after the image is provided at 104, it is to be understood that such selection(s) may be received or provided before image data is provided. In an embodiment, for example, the user selection(s) may be predetermined or set to a default setting for all image data provided to the processor or system. Alternatively, in an embodiment, the user setting may be manually set for each set of image data that is provided. In an embodiment, the user's selection(s) are directly used in determining the compression scheme. In another embodiment, user selection can be used to determine if one of many existing compression schemes (e.g., MRC) is to be applied to the image data. For example, if a user selects that the original or input image data comprises pictorial (picture) and text information, a compression scheme may be determined based on such input. In that case, in an embodiment, a MRC segmentation method may be used to tag the image data/pixels (for later processing). In yet another embodiment, the image data type information determined by the processor or system may be used with and/or combined with user selections to determine a compression scheme of the image data at 118 (e.g., which best suits the image and the user).

The determined compression scheme at 118 for compressing the image data at 120 may comprise any number of compression techniques for compressing image data, including, but not limited to, the MRC segmentation techniques (3-layer MRC model, N-layer MRC model, 3+1 layer MRC model, and 3+N layer MRC model) or a JPEG compression scheme. Also, it should be understood by those skilled in the art that the herein described methods as depicted in the Figures may be extended to include any other compression schemes that are invented in the future, and are not limited to selecting those listed above and in the disclosed embodiments.

Figure 5:
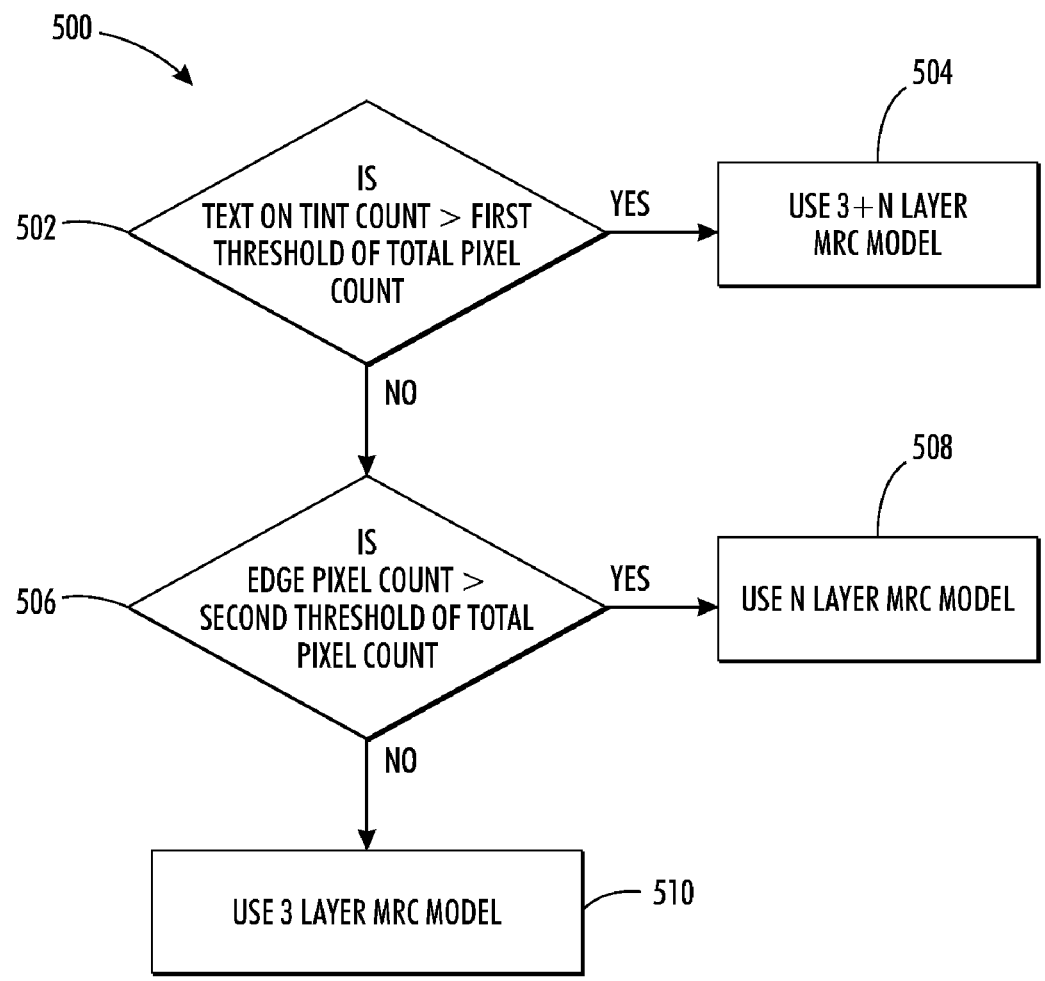
FIG. 5 illustrates an exemplary flow diagram for determining a compression scheme to be used in accordance with an embodiment of the present disclosure.
Figure 6:
FIG. 6 illustrates an exemplary look up table that may be used to determine a compression scheme in accordance with an embodiment of the present disclosure.

In addition to the acts shown in the method of FIG. 1, a processor (or module) may implement additional acts to assist in determining the compression scheme. The compression scheme for compressing the image data may be based on a relative or absolute amount of each type of data in accordance with a predetermined scheme. That is, in an embodiment, an amount of each type of data (e.g., number of pixels or percentage of pixels) may be determined based on a relative comparison of that particular type of data to another amount. The comparison may be between two or more types of data, to one or more thresholds, and/or to a total number of pixels in the image data, for example. Such comparisons, however, should not be limiting. In another embodiment, an absolute amount of data may be used to determine and/or select a compression scheme. That is, the amount of a particular type of data independent from other amounts or types of data (if present) may be used to determine the compression scheme. The predetermined scheme may be a compression scheme that is associated with either the relative or the absolute amount(s) of image data in a document. For example, the predetermined scheme may be based off of compression method(s) available in a processor in a device or system. FIGS. 5 and 6, described below, provide examples of how a compression scheme may be determined in accordance with predetermined scheme(s) using a processor, for example.

Figure 2:
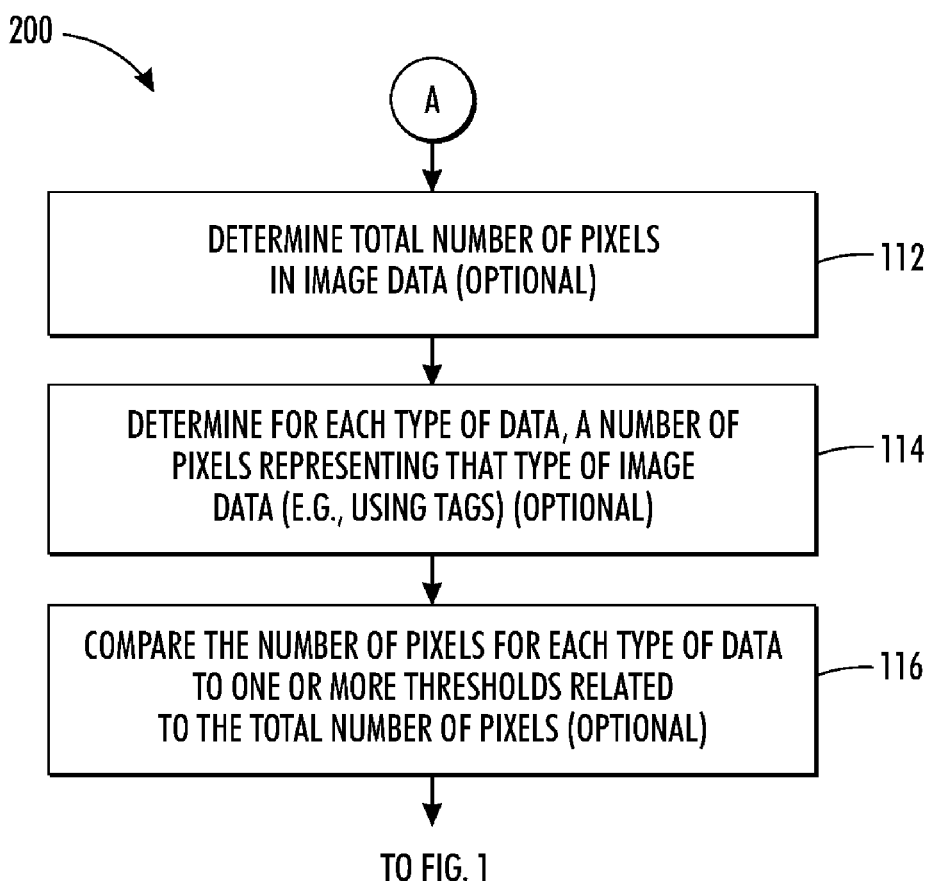
FIG. 2 illustrates a flow diagram of a method for comparing pixels of image data to determine the compression scheme for provided image data in accordance with an embodiment.

For example, FIG. 2 illustrates a method 200 in accordance with an embodiment for comparing pixels of image data to determine a compression scheme for provided image data. In the illustrated embodiment, a percentage of each type of data is determined and used for comparison to threshold(s) for determining a compression scheme. As shown, after at least one type of image data represented by the pixels is determined at 108, the total number of pixels in the image data are determined at 112 (i.e., the total number of pixels are counted). Then, method 200 determines at 114 a number of pixels representing each type of image data in the provided image data. That is, for each type of data determined at 108, the pixels are counted. In some cases, the pixels may be optionally tagged, as shown at 110. Thus, the tags may be used to calculate or count the number of pixels for each type of data.

Although not specifically shown, the number of pixels representing each type of data may be compared to the total number of pixels in image data to determine a percentage of each type of data in the image data (e.g., 30% background, 60% text, etc.) The number of pixels for each type of data may then be compared to one or more thresholds related to the total number of pixels, as shown at 116. The comparison(s) made at 116 can be used to determine the compression scheme, i.e., based on the relative amount of each type of data, the compression scheme may be chosen in accordance with a predetermined scheme.

The one or more thresholds for comparing the number of pixels thereto may be predetermined thresholds or dynamic threshold (e.g., changing depending on the determined data type(s)). In an embodiment, a range of thresholds may be provided (e.g., to choose between different MRC models). For example, if provided image data includes three (3) types of image data—e.g., background, text, and pictorial—the numbers or percentages of pixels for each type may be compared to a threshold. Using one or more of these comparisons, the compression scheme is selected/determined. In an embodiment, a comparison is made for each type of data determined in the provided image data. In an embodiment, the type(s) of data may be compared based on algorithms that are predetermined based on the types of data found in the image.

However, it is to be understood that the blocks of FIGS. 1 and 2 are not meant to be limiting. For example, it is to be understood that although FIG. 2 illustrates the determination of the total number of pixels at 112 being performed after 108, such a determination may be made after image data is provided at 104.

Figure 3:
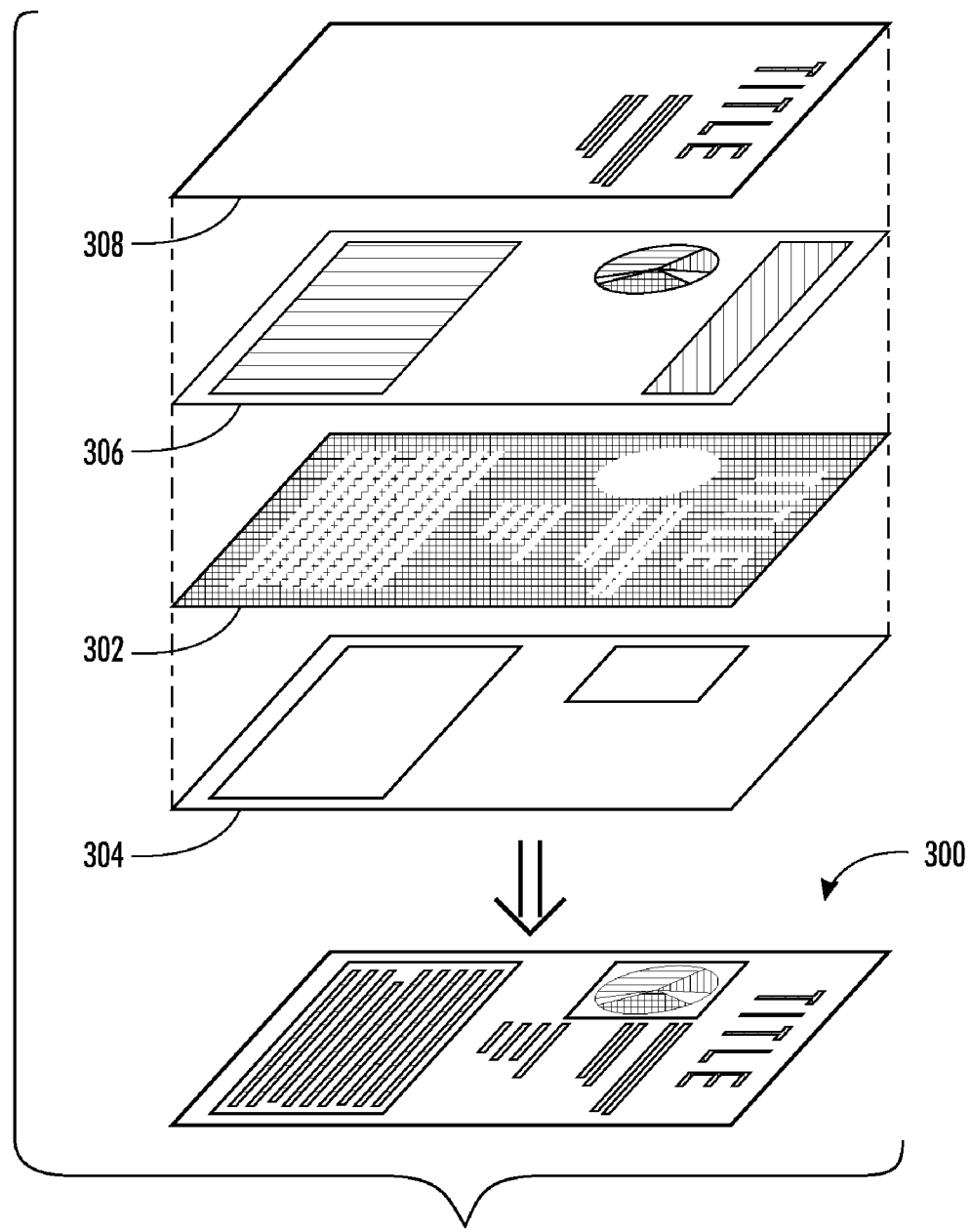
FIG. 3 illustrates an exemplary embodiment of an MRC segmentation structure for compressing image data of documents.

As noted above, one compression/file format that is offered is mixed raster content (MRC). MRC format includes image data in more than one image plane—an approach to satisfying the compression needs of differing types of data—which separates image data into a plurality of planes and separately applies an appropriate compression technique to each image plane. FIG. 3 illustrates an exemplary embodiment of an MRC format or segmentation technique for compressing image data representing a page 300 or document. Each of the planes 302-308 shown for the image data may also be considered layers, and, therefore, the terms "plane" and "layer" are used interchangeably herein, and should not be limiting. Separate compression techniques that are adapted to the types of data stored may be used for each plane.

As shown in the illustrated embodiment, the image data of the page 300 may be segmented into a plurality of planes including a background plane 304, at least one foreground plane 306, and an associated selector or mask plane 302. In some embodiments, one or more optional planes 308 may be provided. In some cases, optional plane 308 may be a hint plane (sometimes also referred to as a rendering plane) used to assist the rendering of the page 300 to output the content of page 300 to different displays or marking devices, for example. In other cases, for example, optional plane 308 may represent a text layer (e.g., black text).

Typically, each plane is used for holding or storing information/image data related to the page 300 or document. As is generally known in the art for MRC image formats, any number N of foreground color and mask plane pairs 306, 302 may be provided. Thus, the planes or layers shown in FIG. 3 are exemplary and should not be limiting. For example, two common kinds of MRC models are 3-layer and N-layer models. The three layers in the 3-layer MRC model are foreground and background, which are multi-level, and mask, which is bi-level. In a typical 3-layer MRC model, the final image is obtained by using the mask later to select pixels from the other two layers. Examples of segmentation algorithms used to generate MRC images that may be utilized in the method of this present disclosure include U.S. Pat. No. 7,242,802, entitled "Segmentation Method and System for Multiple Raster Content (MRC) Representation of Documents," issued Jul. 10, 2007, and U.S. Pat. No. 7,343,046, entitled "Systems and Methods for Organizing Image Data into Regions," issued on Mar. 11, 2008, both of which are assigned to the same assignee (Xerox Corporation) of the present disclosure, and both of which are incorporated herein by reference in their entirety. Depending on the type of image data, 3-layer MRC models may sometimes provide poor image quality due to color fringing and text may not always be clear. In an N-layer MRC model, the text is mostly extracted in N contone mask layers, whereas the background holds all the pictorial and graphics information. Optional layer 308 of FIG. 3 may be an N-layer, for example. Most of the N-layer MRC models give good text quality on white background, may not for text on tint.

In an embodiment, the foreground layer 306 is separated in various independent sublayers or subplanes, based on, for example, color and spatial proximity of the pixels. Each of the foreground layers can be binarized having a specific color, for example.

Also, 3+1 layer models or 3+N layer models are processes that may be used to segment, compress, and process image data. A 3+N layer model combines 3-layer and N-layer MRC models. For example, a 3+N layer model may be applied a three-layer MRC model to the pictorial regions (pixels) of an image, and the N-layer model to the text regions. The layer may be integrated with each other to create a 3+N layer structure. U.S. application Ser. No. 12/564,520, filed Sep. 22, 2009 and assigned to the same assignee (Xerox Corporation), which is hereby incorporated by reference in its entirety, provides an example of a 3+N layer model that may be selected and used for segmenting and compressing the image data. 3+N layer MRC models could, however, have a performance impact on the image, depending on the type of data, and provide slightly bigger file sizes. U.S. application Ser. No. 12/328,973, filed Dec. 5, 2008, assigned to Xerox Corporation, and also incorporated herein by reference in its entirety, provides an example of a 3+1 layer MRC model that may be determined for compressing the image dat. Such a 3+1 layer MRC model adds a black text layer on top of a 3-layer MRC model and can be used for typical office documents.

Additionally and/or alternatively, as previously noted, the determined compression scheme is not limited to MRC techniques. In embodiments, other compression techniques, such as JPEG compression, may be determined at 118 and used to process image data. This method can be extended to binary images as well. In that case, it may include JBIG2, G4 and many other binary compression schemes. The method may also apply compression schemes or techniques that are developed in the future.

In an embodiment, a look up table (LUT) may be used to determine the compression scheme. FIG. 6 illustrates an exemplary LUT Table 1 that may be used to determine a compression scheme in accordance with an embodiment of the present disclosure. As previously noted, the determined scheme may be based on a predetermined scheme. In the illustration, Table 1 includes columns 600 and 602 with information associated with an embodiment wherein the compression scheme is determined based on receiving a user's selection of the type of data 600 provided and compression quality 602 selected. Based on the user's selection, an MRC model as indicated in column 604 may be determined. Of course, other information may be provided in the LUT (e.g., other types of compression techniques, user inputs, etc.). Example 2 (below) describes example embodiments for using LUT to determine the compression scheme.

The MRC method or model chosen for separating provided input image data should not be limiting. As noted above, each of the MRC models or compression techniques can provide advantages or disadvantages based on the type of data being processed and compressed. JPEG is a compression method that may be offered as part of MRC or as a stand alone compression method. Thus, the method 100 may determine that two or more compression techniques may be used for processing image data. As such, the method 100 allows for a dynamic determination and application of compression scheme to achieve optimal file size, image quality balance, and output of images. In addition to improving the image quality, method 100 improves compression ratios of provided images.

Figure 4:
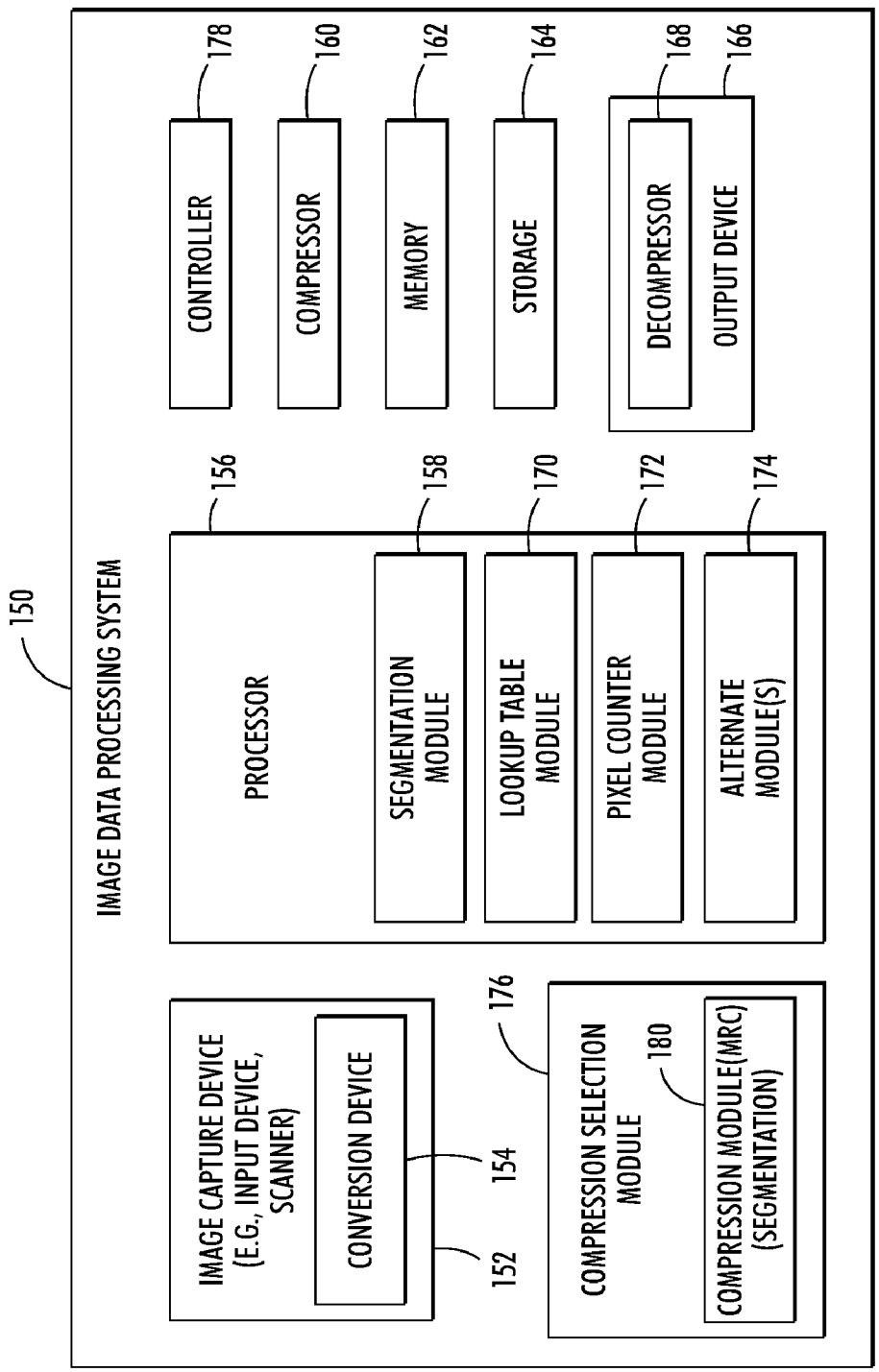
FIG. 4 is a block diagram illustrating an exemplary image data processing system in accordance with an embodiment of the present disclosure.

FIG. 4 is a block diagram illustrating an exemplary image data processing system in accordance with an embodiment of the present disclosure. For example, the system 150 may comprise an image capture device 152, a processor 156, a compression selection module 176, a compressor 160, memory 162 and/or storage 164, and an output device 166. Each of the devices shown in system 150 may also be considered modules, and, therefore, the terms "device" and "module" are used interchangeably herein. Furthermore, the devices or modules illustrated in FIG. 4 are not meant to be limiting. An example of segmentation algorithms and/or modules used to generate segmented images that may be utilized in this present disclosure include the hereby incorporated '802 and '120 patents. It is to be understood that any number of elements or modules may be used (e.g., more or less modules may be used and/or combined) and that additional operations or processes besides those described below may be provided.

Referring back to the exemplary system 150 of FIG. 4, the image capture device 152 is configured to provide and/or receive image data, such as an input device. The image capture device 152 may comprise any type of device for providing, receiving and/or inputting image data, such as an input image terminal, scanning device, facsimile device, computing device, copying device, MFD, storage device, etc. In an embodiment, the image capture device 152 may comprise a conversion device 154 for converting the image data, such as converting grayscale image data from an input device color space, such as RGB (red, green, blue), to a device independent processing color space, such as YCC or LAB color space, where intensity and color information (i.e., luminance and chrominance) are separated. Generally, the types of color spaces for image data and the conversion of such color spaces are known in the art. The conversion device 154 may be a part of the image capture device 152 or a separate device or module. At least one compressor 160 is provided in system 150, and is configured to compress the image data received by the image capture device 152 and processed by the processor 156. For example, the compressor 160 compresses the image data using the determined compression scheme in 118 of method 100.

A processor 156 may be configured to process pixels of the image data in order to separate or segment the image data signal (or input data) into layers, using a segmentation module 158, for example. The processor 156 may be instructed by a controller 178 to segment and/or process the image data that is provided or received. Segmentation module 158 segments the image data for compression. In an embodiment, the segmentation module 158 may be used for segmentation in the front image path (i.e., before determining the type of image data and compression scheme) and for determining the compression scheme, for example. In an embodiment, segmentation module 158 may be configured to segment and optionally tag the image data (e.g., each of its pixels) to identify the type of data represented before a compression scheme is determined and/or selected.

In an embodiment, a compression selection module 176 may be provided in system 150 to determine the compression scheme. Compression selection module 176 may comprise a compression module 180 that applies a selected compression scheme (and may also be used for further segmentation). For example, compression module 180 may apply one or more MRC compression schemes to image data which may have been processed by segmentation module 158, for example. In an embodiment, compression module 180 could apply MRC compression techniques to the image data to determine which of the many available MRC compression schemes (or other schemes) will be used and selected by compression selection module 176 to process the image data. In an embodiment, compression module 180 may store or retrieve stored compression schemes (e.g., from memory 162 or storage 164) that are available in a particular system or device to process the image data. Although the compression selection module 176 is shown in FIG. 4 as being separate from the processor 156, it should be understood by one skilled in the art that in an embodiment, the compression selection module 176 may be a module that is part of the processor 156 or connected thereto.

Processor 156 may also include a look-up table module 170, pixel counter module 172, and one or more other or alternate module(s) 174. Look-up table module 170 may include one or more LUTs, which can used to convert color foreground and background data from device dependent to device independent color space (e.g., YCC to L*a*b) before compression, and/or to determine a compression scheme for compressing image data, for example. Pixel counter module 172 may be used to count the number of pixels in images (e.g., for applying tags, counting a total number of pixels), for example. Alternate modules 174 may correspond to other modules for processing and/or manipulating data such that the output image may be further improved. The addition of such modules should not be limiting.

The processor 156 (and/or its associated modules, e.g., modules 158, 170, 172, 174, and 176) and/or compression selection module 176 (which may include compression (MRC) module 180) may be used to perform or implement the steps 108-118 as described in method 100 of FIGS. 1-2, for example. The processor or processing elements may be a combination of image processing elements or modules which comprise software and hardware elements that may perform a number of operations on the image data received from the image capture device 152 using a set of parameters. The parameters may be used to convert the images to the format desired as output (e.g., high quality) along an image path. The elements may be a part of a computer system, device, or apparatus such as a xerographic system, a photocopier, a printing device, or a multi-function device (MFD).

Memory 162 and/or storage 164 are storage devices for storing the image data, such as noted at 122 in method 100. An output device 166 may be provided to output the image data as noted at 126. Output device 166 may be any type of device that is designed to output the image data. For example, the output device may display, copy, print, or send the image data. Such an output device may be an MFD, printer, copier, scanner, facsimile device, display, a terminal, an image storage system, or CPU, for example. In an embodiment, the output device 166 may decompress the image data and its information in the background metadata before output, such as noted at 124 in method 100. In an embodiment, a decompressor 168 is provided in system 150 to decompress image data before sending the image data to output device 168, if needed. The decompressor 168 and output device 166 may be the same module, or separate modules.

Additionally, in some embodiments, additional modules may be provided in system 150. For example, threshold, comparator and/or metadata generating devices or modules may be provided in system 150.

The processor 156 (and/or its elements) and/or compression selection module 176 may execute machine readable executable instructions stored in memory 162 or storage 164. For example, the method described herein may be stored the form of computer executable instructions so as to provide a computer readable media or data structure that may be executed by a computer to direct a computer to perform the method to reduce the file size of the image data.

The following examples show how method 100 shown in FIG. 1 and processor 156, compression selection module 176, or system 150 shown in FIG. 4 can be used to process image data:

EXAMPLE 1

Image data provided or received by a processor comprises pixels representing data including text, text on tint, and edge information. That is, a page or document comprise three types of image data for processing and compression. As noted above, any number of methods may be used to determine the type of data represented by the pixels of image data (e.g., user selection, processing by the processor, segmentation (e.g., at a front end of the image path), and/or tagging), and such determinations should not be limiting. In this embodiment, each of the pixels are segmented and tagged using segmentation module 158 of FIG. 4 to identify the type of data represented (text, text on tint, or edge) before the compression scheme is determined. The determination of the compression scheme for the image data includes processing the pixels of image data using similar steps shown in method 100 of FIGS. 1 and 2, including counting and comparisons to thresholds based on a total number of pixels in the image data.

More specifically, FIG. 5 illustrates a method for the determination of the compression scheme in accordance with a predetermined scheme involving the following steps:

If the image data comprises a relatively large number of text on tint pixels in the tag plane, i.e., if a number (or count) of text on tint pixels is greater than a first threshold (e.g., percentage) of a total pixel count of the image, or the answer is "YES" to block 502, the image data is compressed using a 3+N layer MRC model (e.g., applied by MRC compression module 180 or compressor 160 of FIG. 4) as shown at block 504. Any of the herein mentioned thresholds may be predetermined or dynamically determined.

Else, if the answer is "NO" at 502, then it is determined if there are a large number of edges in the image data, i.e., if the number of edge pixels is greater than a second threshold of the total pixel count. If the answer is "YES" to block 506, an N layer model would be determined and applied to the image data (using MRC segmentation module 180 or compressor 160) as shown at block 508;

Else, if the answer is "NO" to blocks 502 and 506, a 3 layer MRC model would be determined and applied the image data as shown at block 510.

EXAMPLE 2

In this exemplary embodiment, the determination of the compression scheme is limited to being selected from a number of different MRC models. In this embodiment, information regarding how to determine the compression scheme for compressing the image data is based on user input. For example, as noted above, a user may input via a user interface features relating to the image data for consideration. In this embodiment, the determination of the at least one type of data is received by a user's selection regarding the type of image data being originally provided. For example, such original types may include, but are not limited to, text data, mixed data, and/or media (e.g., newspaper, magazine). Also, in this example, a compression quality selected by the user for output of the image data is used to determine the compression scheme.

As previously noted, an LUT may be used to determine the compression scheme. Table 1 in FIG. 6 shows an example of such an LUT wherein the compression scheme is chosen based on the type of data 600 and compression quality 602. Specifically, in these embodiments, an MRC model is chosen. For example, in an embodiment as shown in the second row of the Table 1, where the data type is user selected as mixed and the compression quality (for output) is medium, a 3-layer MRC model is chosen for compression (and applied, if applicable), as shown in column 604. In another embodiment, as shown in the fourth row of Table 1, the user-input type of image data is text and the selected compression quality is high. A 3+N layer MRC model is determined for compression. In yet another embodiment, where the providing image data is determined via the user to include a media type of image data and for a low compression quality, as shown in the ninth row of Table 1, an N-layer MRC model is determined for compression.

EXAMPLE 3

Figure 7:
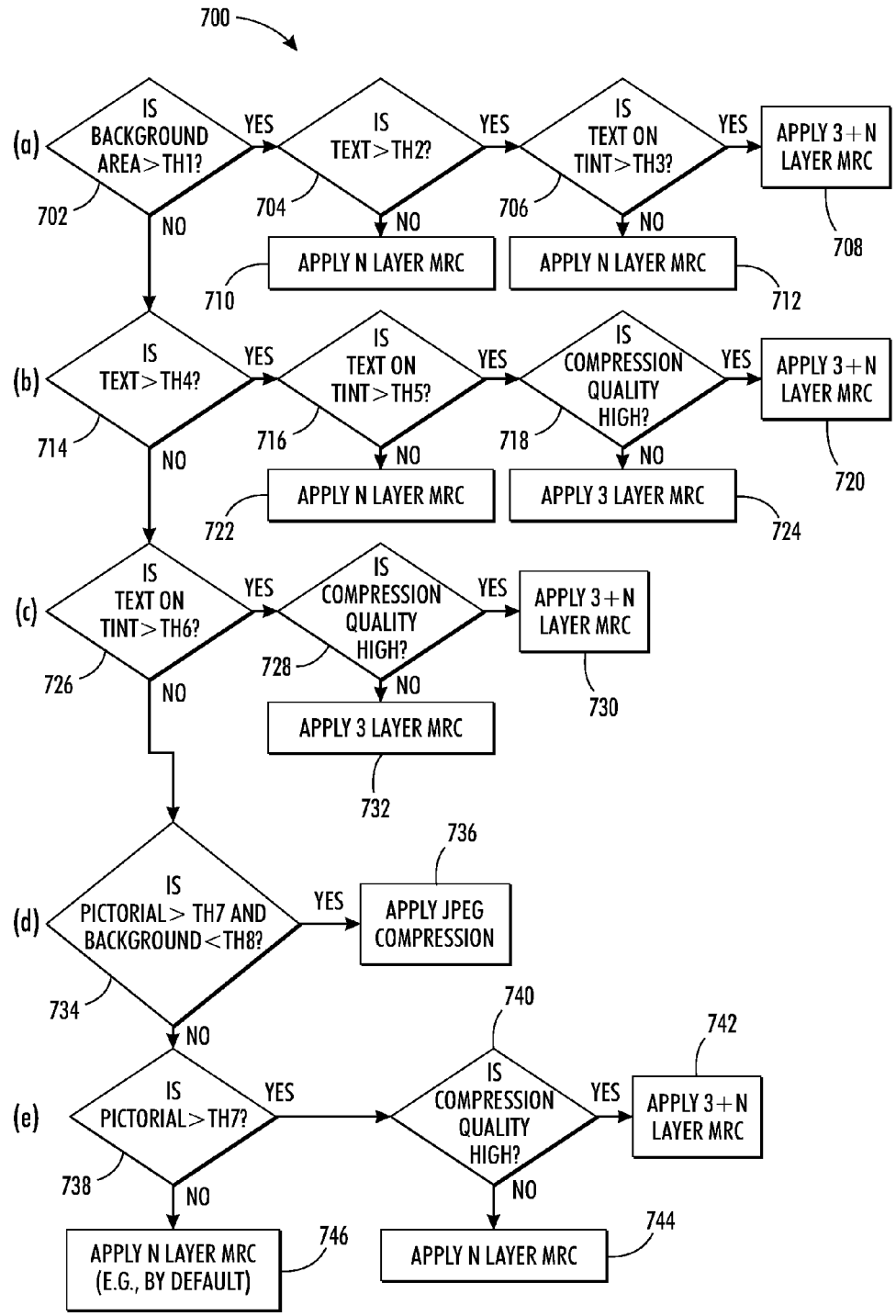
FIG. 7 illustrates another exemplary flow diagram for determining a compression scheme to be used in accordance with an embodiment of the present disclosure.

In this exemplary embodiment, the determined compression scheme is selected based on the user selections as well as the image data type. The image data is segmented and the pixels are tagged. The image data tags indicate pixels representing text, text on tint, pictorial, and background data. To determine the compression scheme, a pixel counter module (such as module 172 in FIG. 4) counts a number of tags representing pixels for each type of data in the image. It then calculates a percentage of each tag from the total pixel count of the image. FIG. 7 illustrates an exemplary flow diagram depicting a method 700 for determining a compression scheme of this image data, which may involve the following steps:

Part (a)

1) If the background area (e.g., count of pixels or percentage of pixels) in an image is greater than a first threshold TH1 (i.e., YES), as shown at 702, 2) Then the text pixels are processed at 704. If their count/percentage is greater than a second threshold TH2 (i.e., YES), 3) Then the text on tint pixels are processed at 706. If the count/percentage is greater than a third threshold TH3 (i.e., YES), the compression selection module will apply a 3+N layer MRC scheme to the image data, as shown at 708.

4) If only conditions 1) and 2) above are true but condition 3) is not (i.e., NO at 706), an N layer MRC scheme is selected (and applied) the image data, as shown at 712.

5) Also, if only condition 1) is true, and at 704 the text count/percentage is not greater than second threshold TH2 (i.e., NO), then an N layer MRC scheme is selected (and applied) the image data, as shown at 710.

Part (b)

6) If at 702 it is determined that the background area is not greater than first threshold TH1 (i.e., NO), it is then determined if the tagged text pixels are greater than a fourth threshold TH4 at 714. If the text pixels are greater than fourth threshold TH4, 7) Then the text on tint pixels are processed at 716. If the count/percentage is greater than a fifth threshold TH5 (i.e., YES), 8) It is determined at 718 if the user selected (or machine default selection) compression quality is high. If YES, the compression selection module will apply a 3+N layer MRC scheme to the image data, as shown at 720.

9) Else, if the compression quality is not high (i.e., NO), a 3 layer MRC compression scheme is applied to the image data, as shown at 724.

10) If only condition 6) is true, and at 716 the text count/percentage is not greater than fifth threshold TH5 (i.e., NO), then an N layer MRC scheme is selected (and applied) the image data, as shown at 722.

Part (c)

11) If at 714 it is determined that the text pixels are not greater than fourth threshold TH4 (i.e., NO), (the background area also not being greater than first threshold TH1), it is then determined if the tagged text on tint pixels are greater than a sixth threshold TH6 at 726. If the text pixels are greater than sixth threshold TH6, 12) Then it is determined at 728 if the user selected (or machine default selection) compression quality is high. If YES, the compression selection module will apply a 3+N layer MRC scheme to the image data, as shown at 730.

13) Else, if the compression quality is not high (i.e., NO), a 3 layer MRC compression scheme is applied to the image data, as shown at 732.

Part (d)

14) If none of the background area, text, or text on tint pixels (count/percentage) are determined to be greater than one of the thresholds (TH1, TH4, and TH6), it is determined if pictorial image data is greater than a seventh threshold TH7 and if the background is less than an eighth threshold TH8 at 734. If both conditions at 734 are true (i.e. YES), 15) Then a JPEG compression scheme is selected (and applied) to the image data, as shown at 736.

Part (e)

16) Else, if condition 14) at 734 is not true (i.e., NO), it is determined at 738 if the pictorial data is greater than seventh threshold TH7. If YES, i.e., background data is not less than eighth threshold TH8, 17) Then it is determined at 740 if the user selected (or machine default selection) compression quality is high. If YES, the compression selection module will apply a 3+N layer MRC scheme to the image data, as shown at 742.

18) Else, if the compression quality is not high (i.e., NO), an N layer MRC compression scheme is selected (and applied) to the image data, as shown at 744.

19) If condition 16) is not true, i.e., pictorial data is not greater than seventh threshold TH7 and none of the conditions 1), 6), and 11) are true (i.e., NO), an N layer MRC compression scheme is selected (and applied) to the image data, as shown at 746. N layer MRC compression may be a default compression scheme that may be applied to the image data, for example.

The thresholds noted in Example 3 may be predetermined, selected, or adjusted based on the type of system/machine, type of data to be processed, and/or a number of other factors as generally known in the art. For example, a typical compression scheme determination or selection for newspaper/magazine and text & linear original image data types could be N layer MRC, such as for low and medium compression quality settings. A typical compression scheme selection for photo image data could be JPEG. For mixed original types, such as those at a high compression quality, a 3+N layer MRC compression scheme could be applied. For low and medium compression quality, image data may only go through a 3+N layer MRC compression scheme is text is greater than a predetermined threshold. Otherwise, the image data can be compressed using a 3 layer MRC compression scheme. Using each of the above described typically applied compression schemes, for example, the exemplary thresholds of FIG. 7 may be determined and based on such conditions (e.g., so that the best compression scheme for the data type may be applied).

The method shown in FIG. 7 is one example of how a compression scheme may be determined and applied to image data. Also, in an embodiment, each of the above steps may be represented by tags placed on the image data (e.g., using segmentation module 158 of FIG. 4) and processing such information. The possible tags that may be provided (e.g., background, text, text on tint, pictorial) or determinations of the type(s) of image data are also exemplary. The method disclosed herein should not be restricted to these exemplary tags and/or compression scheme selections. That is, in embodiments, additional and/or alternate tags could also be used (other than those shown in FIG. 7) as well as other compression schemes (that are presently known or determined in the future). For example, such tags may represent image data/pixels that are halftone, neutral edges, or color edges. Other compression schemes may include JBIG2, G4, or other binary compression schemes.

The above Examples are not meant to limit the scope of this disclosure or the determinations as provided in this disclosure. Other combinations of compression schemes can be defined based on available segmentation techniques, tagging, user selections, and the like.

As such, no matter what steps, conditions, or thresholds are used to analyze the image data, after the compression scheme data is determined (e.g., using compression selection module 176), the image data may be compression and/or segmented by the compression module 180. For example, if a 3+N layer MRC model is determined for compression, the data may be segmented to generate a background layer, one or more binary foreground layers, a sub-background layer, a selector layer, and a sub-foreground layer (such as shown in the incorporated application Ser. No. 12/564,520). With reference to Example 3, for example, in an embodiment, the sub-foreground layer may comprise text-on-tint information, pictorial color information, and/or pictorial edge information. In an embodiment, the sub-background layer may comprise pictorial and background information.

In one embodiment, if an MRC compression scheme is to be applied based on user selection (such as described in Example 2), compression module 180 could apply MRC techniques to the image data to determine which of the many available MRC compression schemes will be used.

Furthermore, it is noted that the method and device as herein-described and is not meant to be limiting. For example, alternative steps and/or other methods which use image statistics (e.g., types and/or quantities of data) and user selections for determining compression schemes are envisioned to be within the scope of this disclosure.

While the principles of the invention have been made clear in the illustrative embodiments set forth above, it will be apparent to those skilled in the art that various modifications may be made to the structure, arrangement, proportion, elements, materials, and components used in the practice of the invention.

It will thus be seen that the objects of this invention have been fully and effectively accomplished. It will be realized, however, that the foregoing preferred specific embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A processor-implemented method for processing image data comprising a plurality of pixels, the method comprising the following acts implemented by a processor:

determining at least one type of data represented by the plurality of pixels;

determining, for each type of data, a number of pixels from the image data representing that type of data in the image data, and determining a compression scheme for compressing the image data based on a relative or absolute amount of each type of data in accordance with a predetermined scheme.

2. The method according to claim 1, further comprising tagging the pixels of image data to identify the type of data represented.

3. The method according to claim 1, further comprising: determining a total number of pixels in the image data, and wherein the determination of the compression scheme comprises comparing the number of pixels for each type of data.

4. The method according to claim 3, wherein the comparing comprises comparing the pixels for each type of data to one or more thresholds.

5. The method according to claim 4, wherein the one or more thresholds are related to the total number of pixels in the image data.

6. The method according to claim 1, wherein the determination of at least one type of data comprises processing each pixel to identify a type of data represented by the pixel.

7. The method according to claim 1, wherein the determination of at least one type of data comprises receiving a user's selection of the type of data provided.

8. The method according to claim 1, wherein the determination of the compression scheme is further based on a compression quality selected for output of the image data.

9. The method according to claim 1, wherein the compression scheme is a mixed raster content (MRC) segmentation technique selected from the group consisting of the following: 3-layer MRC model, N-layer MRC model, 3+1 layer MRC model, and 3+N-layer MRC model.

10. The method according to claim 1, wherein the compression scheme is selected from the group consisting of the following: JPEG, JBIG2, G4, or a binary compression scheme.

11. A system for processing image data comprising a plurality of pixels, the system comprising:

an input device for receiving the image data;

a processor configured to process the image data, the processor comprising code executable by the processor for performing a method comprising:

determining at least one type of data represented by the plurality of pixels;

determining, for each type of data, a number of pixels from the image data representing that type of data in the image data, and determining a compression scheme for compressing the image data based on a relative or absolute amount of each type of data in accordance with a predetermined scheme.

12. The system according to claim 11, wherein the method further comprises tagging the pixels of image data to identify the type of data represented.

13. The system according to claim 11, wherein the method further comprises: determining a total number of pixels in the image data, and wherein determining the compression scheme comprises comparing the number of pixels for each type of data.

14. The system according to claim 13, wherein the comparison comprises comparing the pixels for each type of data to one or more thresholds.

15. The system according to claim 14, wherein the one or more thresholds are related to the total number of pixels in the image data.

16. The system according to claim 11, wherein the determination of at least one type of data comprises processing each pixel to identify a type of data represented by the pixel.

17. The system according to claim 11, wherein the determination of at least one type of data comprises receiving a user's selection of the type of data provided.

18. The system according to claim 11, wherein the determination of the compression scheme is further based on a compression quality selected for output of the image data.

19. The system according to claim 11, wherein the compression scheme is a mixed raster content (MRC) segmentation technique selected from the group consisting of the following: 3-layer MRC model, N-layer MRC model, 3+1 layer MRC model, and 3+N-layer MRC model.

20. The system according to claim 11, wherein the compression scheme is selected from the group consisting of the following: JPEG, JBIG2, G4, or a binary compression scheme.

* * * * *